United States Patent
Foote et al.

(10) Patent No.: US 6,486,029 B1
(45) Date of Patent: *Nov. 26, 2002

(54) INTEGRATION OF AN ION IMPLANT HARD MASK STRUCTURE INTO A PROCESS FOR FABRICATING HIGH DENSITY MEMORY CELLS

(75) Inventors: David K. Foote, San Jose, CA (US); Bharath Rangarajan, Santa Clara, CA (US); Stephan K. Park, Austin, TX (US); Fei Wang, San Jose, CA (US); Dawn M. Hopper, San Jose, CA (US); Jack Thomas, Palo Alto, CA (US); Mark Chang, Los Altos, CA (US); Mark Ramsbey, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/627,563

(22) Filed: Jul. 28, 2000

Related U.S. Application Data

(60) Provisional application No. 60/189,723, filed on Mar. 16, 2000.

(51) Int. Cl.⁷ .......................... H01L 21/8247
(52) U.S. Cl. ...................... 438/261; 438/954
(58) Field of Search ............... 438/257–267, 438/954

(56) References Cited

U.S. PATENT DOCUMENTS 5,966,603 A * 10/1999 Eitan .......................... 438/258
6,265,296 B1 * 7/2001 Yen et al. ..................... 438/586

OTHER PUBLICATIONS

U.S. patent application Ser. No. 09/429,722: "Process for Fabricating High Density Memory Cells Using a Metallic Hard Mask"; Inventors: Bharath Rangarajan, Fei Wang, Dawn M. Hopper, David K. Foote, Stephen K. Park, Jack Thomas, Mark Chang, and Mark Ramsbey; Filed: Oct. 29, 1999; Attorney Docket No. 9076/423.

U.S. patent application Ser. No. 09/430,493: "Process For Fabricating High Density Memory Cells Using a Polysilicon Hard Mask"; Inventors: Bharath Rangarajan, David K. Foote, Fei Wang, Dawn M. Hopper, Stephen K. Park, Jack Thomas, Mark Chang, and Mark Ramsbey; Filed: Oct. 29, 1999; Attorney Docket No. 9076/440.

U.S. patent application Ser. No. 09/429,909: "Process for Fabricating High Density Memory Cells Using a Silicon Nitride Hard Mask"; inventors: . Bharath Rangarajan, David K. Foote, Fei Wang, Dawn M. Hopper, Stephen K. Park, Jack Thomas, Mark Chang, and Mark Ramsbey; filed: Oct. 29, 1999; Attorney Docket No. 9076/442.

* cited by examiner

Primary Examiner—Richard Booth
(74) Attorney, Agent, or Firm—Amin & Turocy, LLP

(57) ABSTRACT

A process for fabricating a memory cell in a two-bit EEPROM device, the process includes forming an ONO layer overlying a semiconductor substrate, depositing a hard mask overlying the ONO layer, and patterning the hard mask. Preferably, the hard mask includes a material selected from the group consisting of tungsten, titanium, titanium nitride, polysilicon, silicon, silicon nitride, silicon oxinitride, and silicon rich nitride. In one preferred embodiment, the process further includes implanting the semiconductor substrate with a p-type dopant at an angle substantially normal to the principal surface of the semiconductor substrate and annealing the semiconductor substrate upon implanting the semiconductor substrate with a p-type dopant. In one preferred embodiment, the process further includes implanting the semiconductor substrate with an n-type dopant.

19 Claims, 5 Drawing Sheets

INTEGRATION OF AN ION IMPLANT HARD MASK STRUCTURE INTO A PROCESS FOR FABRICATING HIGH DENSITY MEMORY CELLS

CROSS-REFERENCE TO RELATED APPLICATION

This application claims the benefit under 35 U.S.C. §119 (e) of the U.S. provisional application Ser. No. 60/189,723, filed on Mar. 16, 2000.

CROSS REFERENCE TO RELATED APPLICATIONS

Related subject matter is disclosed in commonly-assigned, co-pending patent applications entitled "PROCESS FOR FABRICATING HIGH DENSITY MEMORY CELLS USING A METALLIC HARD MASK" Ser. No. 09/429,722, "PROCESS FOR FABRICATING HIGH DENSITY MEMORY CELLS USING A POLYSILICON HARD MASK" Ser. No. 09/450,493, and "PROCESS FOR FABRICATING HIGH DENSITY MEMORY CELLS USING A SILICON NITRIDE HARD MASK" Ser. No. 09/429,909, all cases filed on Oct. 28, 1999.

FIELD OF THE INVENTION

This invention relates generally to non-volatile memory devices. In particular, the present invention relates to a method and process for manufacturing a non-volatile memory device.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Typically, an EEPROM device includes a floating-gate electrode upon which electrical charge is stored. The floating-gate electrode overlies a channel region residing between source and drain regions in a semiconductor substrate. The floating-gate electrode together with the source and drain regions forms an enhancement transistor. By storing electrical charge on the floating-gate electrode, the threshold voltage of the enhancement transistor is brought to a relatively high value. Correspondingly, when charge is removed from the floating-gate electrode, the threshold voltage of the enhancement transistor is brought to a relatively low value. The threshold level of the enhancement transistor determines the current flow through the transistor when the transistor is turned on by the application of appropriate voltages to the gate and drain. When the threshold voltage is high, no current will flow through the transistor, which is defined as a logic 0 state. Correspondingly, when the threshold voltage is low, current will flow through the transistor, which is defined as a logic 1 state. Data resides in a certain logic state on the floating-gate electrode. During a read operation, selected data from a selected floating-gate electrode can be output to an external communication unit using a bit-line.

In a flash EEPROM device, electrons are transferred to a floating-gate electrode through a dielectric layer overlying the channel region of the enhancement transistor. The electron transfer is initiated by either hot electron injection, or by Fowler-Nordheim tunneling. In either electron transfer mechanism, a voltage potential is applied to the floating-gate by an overlying control-gate electrode. The control-gate electrode is capacitively coupled to the floating-gate electrode, such that a voltage applied on the control-gate electrode is coupled to the floating-gate electrode. The flash EEPROM device is programmed by applying a high positive voltage to the control-gate electrode, and a lower positive voltage to the drain region, which transfers electrons from the channel region to the floating-gate electrode. The flash EEPROM device is erased by grounding the control-gate electrode and applying a high positive voltage through either the source or drain region of the enhancement transistor. Under erase voltage conditions, electrons are removed from the floating-gate electrode and transferred into either the source or drain regions in the semiconductor substrate.

Product development efforts in EEPROM device technology have focused on increasing the programming speed, lowering programming and reading voltages, increasing data retention time, reducing cell erasure times and reducing cell dimensions. Many of the foregoing research goals can be addressed through development of materials and processes for the fabrication of the floating-gate electrode. Recently, development efforts have focused on dielectric materials for fabrication of the floating-gate electrode. Silicon nitride in combination with silicon dioxide is known to provide satisfactory dielectric separation between the control-gate electrode and the channel region of the enhancement transistor, while possessing electrical characteristics sufficient to store electrical charge.

One important dielectric material for the fabrication of the floating-gate electrode is an oxide-nitride-oxide (ONO) layer. During programming, electrical charge is transferred from the substrate to the silicon. nitride layer in the ONO layer. Voltages are applied to the gate and drain creating vertical and lateral electric fields, which accelerate the electrons along the length of the channel. As the electrons move along the channel, some of them gain sufficient energy to jump over the potential barrier of the bottom silicon dioxide layer and become trapped in the silicon nitride layer. Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in regions within a single continuous silicon nitride layer.

Non-volatile memory designers have taken advantage of the localized nature of electron storage within a silicon nitride layer and have designed memory devices that utilize two regions of stored charge within an ONO layer. This type of non-volatile memory device is known as a two-bit EEPROM. The two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two-bits to be programmed and read simultaneously. The two-bits of the memory cell can be individually erased by applying suitable erase voltages to the gate and to either the source or drain regions.

While the recent advances in EEPROM technology have enabled memory designers to double the memory capacity of EEPROM arrays using two-bit data storage, numerous challenges exist in the fabrication of material layers within these devices. In particular, fabricating the bit-line oxide region within a memory cell presents several challenges. Traditionally, bit-lines are fabricated using a resist mask, as illustrated in FIGS. 1–5. Referring to FIG. 2, an ONO layer is formed having a first silicon dioxide layer overlying the semiconductor substrate, a silicon nitride layer overlying the first silicon dioxide layer, and a second silicon dioxide layer overlying the silicon nitride layer. A layer of photoresist is then spun on the ONO layer, as illustrated in FIG. 2. The photoresist is then patterned and the semiconductor substrate is doped with a p-type dopant such as boron using ion implantation at a large incidence relative to the principal surface of the semiconductor substrate to allow the p-type implant to be located away from a subsequent n-type dopant, as illustrated in FIG. 3. The wafer is then rotated 180° and the semiconductor substrate is doped a second time with a p-type dopant using ion implantation at a large incidence relative to the principal surface of the semiconductor substrate, as illustrated in FIG. 4. Doping the semiconductor substrate with a p-type dopant creates p-type regions, as illustrated in FIGS. 3–4. The exposed ONO layer is then etched to expose part of the semiconductor substrate. The semiconductor substrate is doped with an n-type dopant such as arsenic using ion implantation at an angle substantially normal to the principal surface of the semiconductor substrate, as illustrated in FIG. 5. Doping the semiconductor substrate with n-type dopants creates n-type regions, as illustrated in FIG. 5. Typically, the ONO layer is then etched before the semiconductor substrate is doped with n-type dopants in order to make the implant of n-type dopants a more controlled implant. Once the n-type dopants have been implanted in the semiconductor substrate, the resist mask is stripped and cleaned from the ONO layer and a bit-line oxide region is thermally grown onto the semiconductor substrate, as shown in FIG. 1.

There are several problems that occur with the above described prior art method for fabricating a memory cell. First, it is difficult to pattern the memory cell on a reflective surface with good critical dimension control. Critical dimensions are the widths of the lines and spaces of critical circuit patterns as well as the area of contacts. In order to fabricate memory cells at high density, one needs to be able to pattern with good critical dimension control. Second, it is difficult to accurately control pocket implants or angled implants. When manufacturing the memory cell, pocket implants, such as p-type regions and n-type regions, are formed in the semiconductor substrate. These pocket implants can be created using n-type dopants or p-type dopants and are an essential component of the memory cell. Third, oxidizing structures, such as the bit-line oxide region, at high densities becomes difficult because of the formation of very large bird's beak structures, as illustrated in FIG. 1. Bird's beak structures form due to the differences in materials used and affect the critical dimensions of the memory cell, as illustrated by the curving of the ONO layer in FIG. 1. By increasing the distance between memory cells, bird's beak structures limit the amount of memory cells that can be placed on a two-bit EEPROM device. Fourth, overlay problems occur if the p-type implant and the n-type implant rely on two different masks. Accordingly, advances in memory cell fabrication technology are necessary to insure patterning of high density memory cells used in two-bit EEPROM devices.

BRIEF SUMMARY

The present invention is for a process for fabricating a memory cell in a non-volatile memory device, preferably in a two-bit EEPROM device. Fabrication of a two-bit EEPROM device having a memory cell requires the formation of a high quality bit-line oxide region. This is because proper functionality of the two-bit EEPROM device during a read operation requires selected data from a selected memory cell to be output to an external communication unit. The output of selected data is performed in the bit-line oxide region. In particular, the bit-line oxide region must have good critical dimension control as well as allow for high density devices. High density devices with good critical dimension control are hard to obtain due to the relatively large bird's beaks that are formed. By fabricating a high quality memory cell having a bit-line oxide region with good critical dimension control, a high-density two-bit EEPROM device can be manufactured.

In one form, a process for fabricating a memory cell includes providing a semiconductor substrate, and forming an ONO layer over the semiconductor substrate. A hard mask is then deposited overlying the ONO layer and patterned. The hard mask comprises a material selected from the group consisting of tungsten, titanium, titanium nitride, polysilicon, silicon, silicon nitride, silicon oxi-nitride, and silicon rich nitride. The semiconductor substrate is then doped with a p-type dopant such as boron, preferably by using ion implantation. The doping of the semiconductor substrate with a p-type dopant causes p-type regions to form in the semiconductor substrate. The p-type implant can be an angled implant, which is an implant at an angle substantially acute with respect to the principal surface of the semiconductor substrate. Preferably, the p-type implant is a direct implant, which is an implant at an angle substantially normal with respect to the principal surface of the semiconductor surface. If the p-type implant is a direct implant, then the p-type implant can be accomplished in one step and the wafer does not have to be rotated 180°, as typically required by the prior art. However, if the p-type implant is a direct implant, the semiconductor substrate must be annealed in order for p-type regions to form under the hard mask. Additionally, if the mask is a hard mask, overlay problems can be reduced or nearly eliminated since the p-type implant and the n-type implant can use the same mask.

After doping the semiconductor substrate with p-type dopants, the semiconductor substrate is doped with n-type dopants such as arsenic, preferably by using ion implantation. The n-type implant is a direct implant. The doping of the semiconductor substrate with n-type dopants causes n-type regions to form in the semiconductor substrate. The exposed ONO layer is then etched to expose part of the semiconductor substrate. Once the ONO layer is etched, the hard mask is not removed and a bit-line oxide region is formed overlying the semiconductor substrate. In one preferred embodiment, the ONO layer is etched prior to the n-type implant or the p-type implant. The hard mask acts as a structural member and provides support for the ONO layer during oxidation. By forming the bit-line oxide region with the hard mask still in place, the bit-line oxide region can form with little or no bird's beak structures. The hard mask is then removed, preferably using a plasma etch process.

Figure 1:
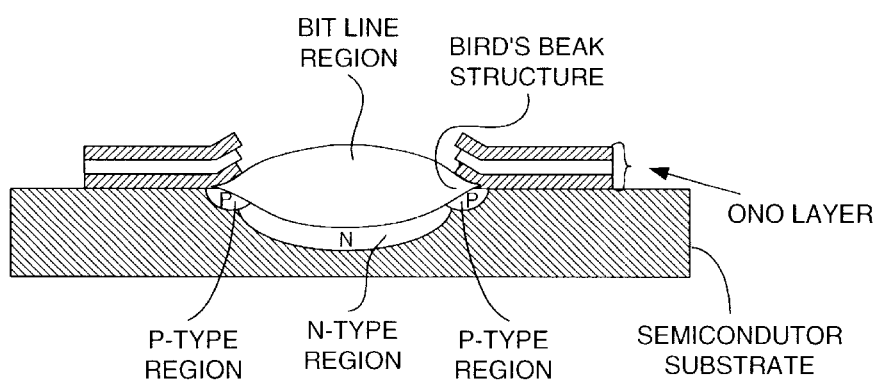
FIG. 1 illustrates, in cross-section, a portion of a semiconductor substrate containing a bit-line oxide region, formed in accordance with prior art methods for fabricating a memory cell.
Figure 2:
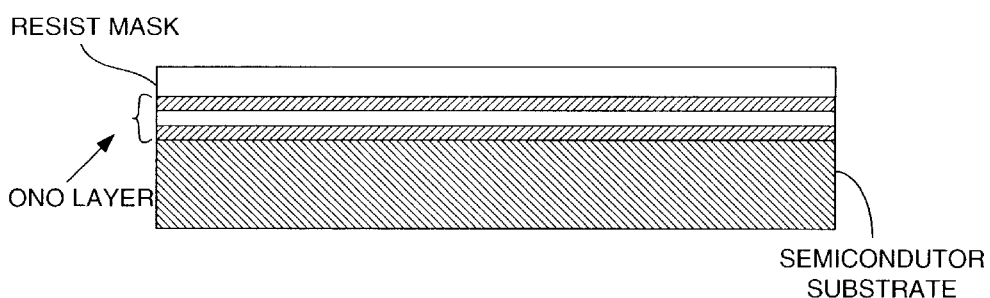
FIGS. 2–5 illustrate, in cross-section, process steps for the fabrication of a memory cell, in accordance with prior art methods for fabricating a memory cell.
Figure 3:
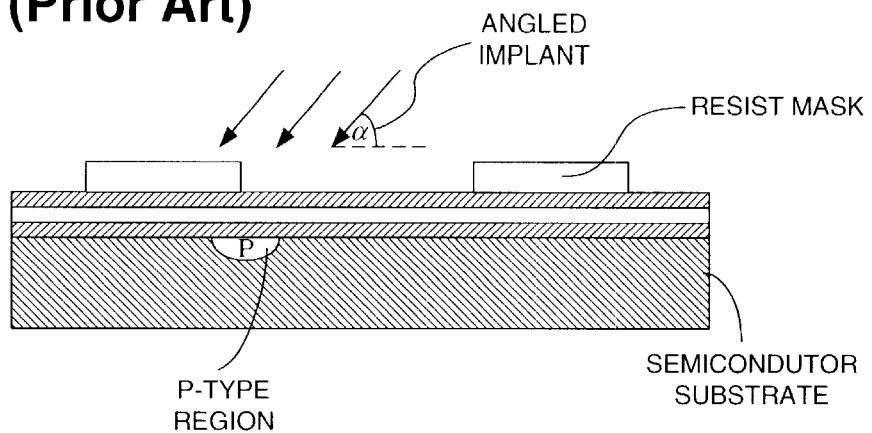
Figure 4:
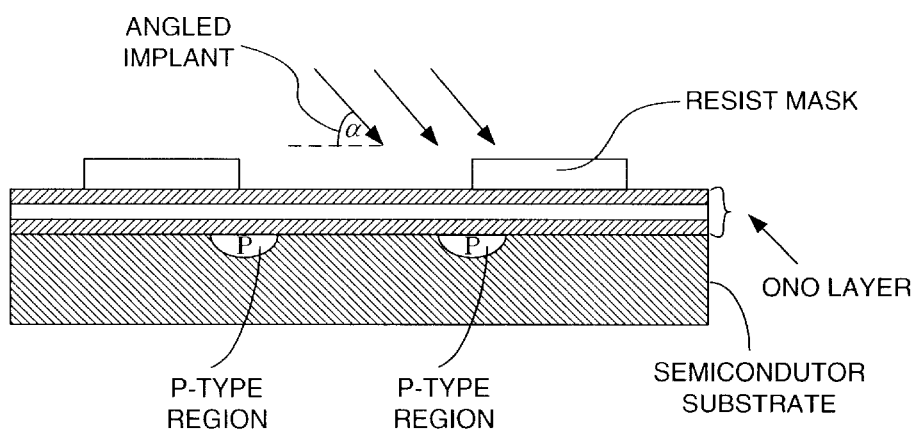
Figure 5:
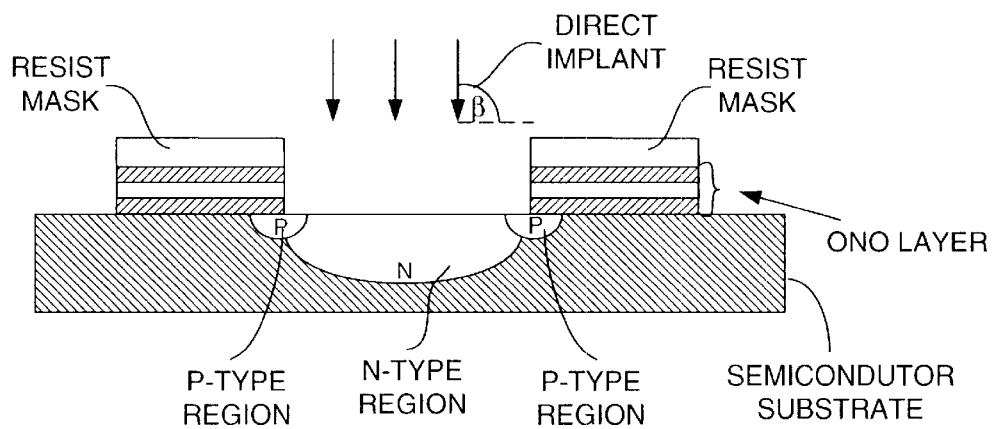

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF PREFERRED EMBODIMENTS

Figure 6:
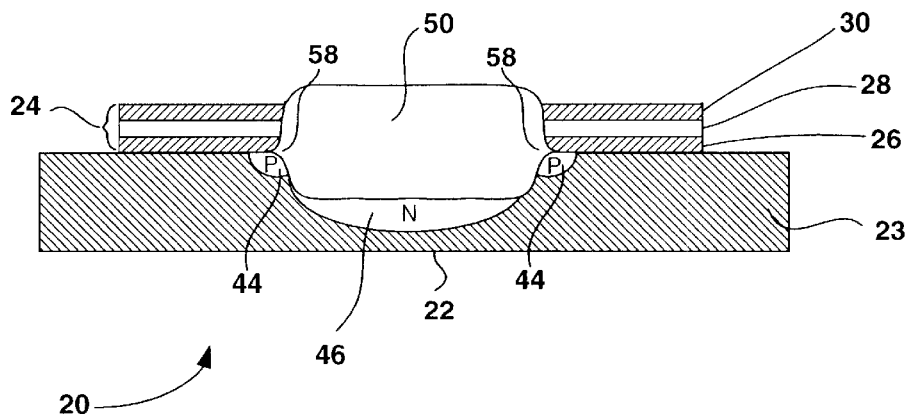
FIG. 6 illustrates, in cross-section, a portion of a semiconductor substrate containing a bit-line oxide region, in accordance with one preferred embodiment of the invention.

Shown in FIG. 6, in cross-section, is memory cell 20 suitable for use in a two-bit EEPROM device. Please note that while all the FIGS. 1–10, illustrate only one memory cell 20, a two-bit EEPROM device may have many more memory cells identical to memory cell 20. For the sake of clarity, these additional memory cells have been left out of FIGS. 1–10.

Memory cell 20 includes p-type regions 44 and n-type regions 46 located in semiconductor substrate 22 and separated by channel region 23, as illustrated in FIG. 6. Bit-line oxide region 50 overlies p-type regions 44 and n-type regions 46, respectively. ONO layer 24 includes first silicon dioxide layer 26 overlying channel region 23. Silicon nitride layer 28 overlies first silicon dioxide layer 26. Second silicon dioxide layer 30 overlies silicon nitride layer 28. In the operation of memory cell 20, data resides in a certain logic state on memory cell 20. During a read operation, selected data from a selected memory cell 20 can be output to an external communication unit by using n-type regions 46. Those skilled in the art will recognize that in order to create higher density memory cells 20, bit-line oxide region 50 must be patterned with good critical dimension control. In order to pattern bit-line oxide region 50 with good critical dimension control and create higher density memory cells 20, bird's beak structures 58 must be reduced by suppressing oxide growth in bit-line oxide region 50. Additionally, avoiding the use of angled implants will also aid in creating memory cells 20 with higher density, since angled implants place restrictions on resist thickness, thus preventing optimal lithography.

In accordance with this invention, a higher density memory cell 20 is achieved by using hard mask 36 instead of a resist mask. One advantage of hard mask 36 is that hard mask 36 can be used to improve photolithography by serving as an anti-reflective coating. An anti-reflective coating spun onto semiconductor substrate 22 can aid in the patterning of small images used in making high density memory cells 20. An anti-reflective coating also brings several advantages to the masking process. First, the anti-reflective coating cuts down on light scattering from the surface into the mask, which helps in the definition of small images. Second, an anti-reflective coating can minimize standing wave effects and improve the image contrast. The use of hard mask 36 can also eliminate the use of angled implants, allowing for higher density memory cells 20. Additionally, hard mask 36 can prevent extended growth of bird's beak structures 58, by suppressing oxide growth in the bit-line oxide region 50. Finally, hard mask 36 has no limitations on space size. The advantages obtained by the present invention can be better understood following a description of a process for fabricating a high density memory cell 20 having bit-line oxide region 50 carried out in accordance with this invention.

Figure 7:
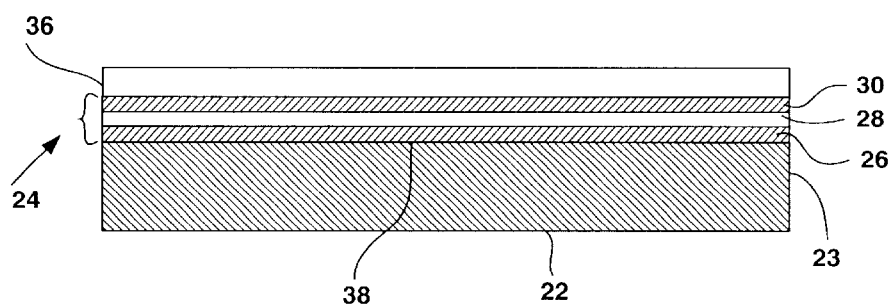
FIGS. 7–10 illustrate, in cross-section, process steps for the fabrication of a memory cell, in accordance with one preferred embodiment of the invention.

Referring to FIG. 7, ONO layer 24 is formed overlying the surface of semiconductor substrate 22. Preferably, semiconductor substrate 22 is a single crystal silicon substrate. Semiconductor substrate 22 has principal surface 38 previously processed and cleaned to remove debris and native oxides. Preferably, ONO layer 24 comprises first silicon dioxide layer 26, silicon nitride layer 28, and second silicon dioxide layer 30. First silicon dioxide layer 26 is formed overlying the semiconductor substrate 22. Preferably, first silicon dioxide layer 26 has a thickness of about 50 to about 150 angstroms and, more preferably, a thickness of about 80 angstroms. After forming first silicon dioxide layer 26, silicon nitride layer 28 is deposited overlying first silicon dioxide layer 26, as illustrated in FIG. 7. Preferably, silicon nitride layer 28 is formed by reacting ammonia $NH_3$ with either dichlorosilane ($SiCl_2H_2$) or silane ($SiH_4$). Preferably, silicon nitride layer 28 is deposited overlying first silicon dioxide layer 26 having an initial thickness of about 120 to about 150 angstroms and, more preferably, an initial thickness of about 135 angstroms. After depositing silicon nitride layer 28, second silicon dioxide layer 30 is formed overlying silicon nitride layer 28, as illustrated in FIG. 7. As second silicon dioxide layer 30 is formed overlying silicon nitride layer 28, silicon nitride layer 28 decreases in thickness to a final thickness of about 50 to about 80 angstroms and, more preferably, a final thickness of about 60 angstroms. Preferably, second silicon dioxide layer 30 has a thickness of about 50 to about 150 angstroms and, more preferably, a thickness of about 80–95 angstroms.

Once ONO layer 24 has been formed, hard mask 36 is deposited overlying ONO layer 24. Hard mask 36 comprises a material selected from the group consisting of tungsten, titanium, titanium nitride, polysilicon, silicon, silicon nitride, silicon oxi-nitride, and silicon rich nitride. In one preferred embodiment, hard mask 36 comprises silicon oxi-nitride or silicon rich nitride since silicon oxi-nitride or silicon rich nitride are known to be effective anti-reflective coatings which help in the formation of the p-type region 44 and n-type region 46. In one preferred embodiment, hard mask 36 comprises silicon oxime film, as described in U.S. Pat. No. 5,710,067, the complete disclosure of which is herein incorporated by reference. Silicon oxime film is useful as an anti-reflection layer during photolithography, as an etch stop, and as a protection layer. In one preferred embodiment, hard mask 36 comprises polysilicon since polysilicon can withstand the annealing process described herein. In one preferred embodiment, hard mask 36 comprises titanium nitride. In one preferred embodiment, hard mask 36 comprises a material selected from the group consisting of titanium, titanium nitride, polysilicon, and silicon, since the materials titanium, titanium nitride, polysilicon, and silicon allow hard mask 36 to be stripped from ONO layer 24 without causing much damage to ONO layer 24. Preferably, hard mask 36 has a thickness of about 500 to about 5000 angstroms and, more preferably, a thickness of about 2000 angstroms.

After hard mask 36 has been deposited, a resist mask is deposited overlying hard mask 36. Preferably, the resist mask is exposed to a light source, such as an x-ray source, which allows for the patterning of the resist mask. Once the resist mask has been patterned, hard mask 36 is etched and patterned. Following the patterning of hard mask 36, the resist mask is removed.

Figure 8:
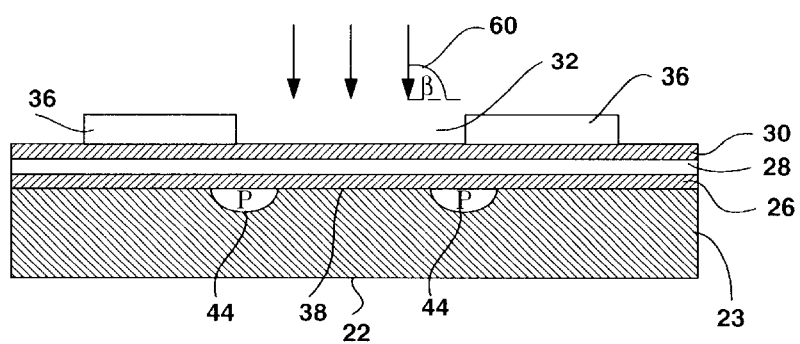

Once resist mask has been removed, semiconductor substrate 22 is then doped with a p-type dopant using hard mask 36 as a doping mask. Preferably, the p-type dopant is boron. In one preferred embodiment of this invention, the semiconductor substrate 22 is doped with a p-type dopant, such as boron, by using ion implantation. Ion implantation allows for the fabrication of memory cell 20 with higher density and smaller feature sizes. A p-type implant is performed to fix the threshold voltage of the select transistor. The p-type implant 62 is preferably boron implanted at a dose of about $1\times10^{12} cm^{-2}$ to about $1\times10^{14} cm^{-2}$ at an implant energy of about 20 KeV to about 80 KeV. The p-type implant is performed through ONO layer 24, but is masked out by hard mask 36, as illustrated in FIG. 8. The p-type implant may be an angled implant performed at an acute angle to the principal surface 38 of the semiconductor substrate 22, such as about a 25° angle, or the p-type implant may be a direct implant 60 performed at an angle substantially normal to the principal surface 38 of the semiconductor substrate 22, such as about a 90° angle, as illustrated in FIG. 8. In one preferred embodiment the p-type implant is a direct implant. If the p-type implant is a direct implant 60, then semiconductor substrate 22 must be annealed. Annealing semiconductor substrate 22 after the p-type implant forces the p-type implant in semiconductor substrate 22 to move away from open region 32 and form p-type regions 44 underneath hard mask 36, as illustrated in FIG. 8. Performing the p-type implant at an angle substantially normal to the principal surface 38 of the semiconductor substrate 22 allows for the fabrication of higher density memory cells since there are no limits placed on the thickness of the mask. Since the p-type implant must be annealed after a direct implant 60, the mask overlying ONO layer 24 should be a hard mask such as hard mask 36 and not a resist mask, such as that used in prior art fabrication methods, because unlike hard mask 36, a resist mask cannot survive the annealing process.

Figure 9:
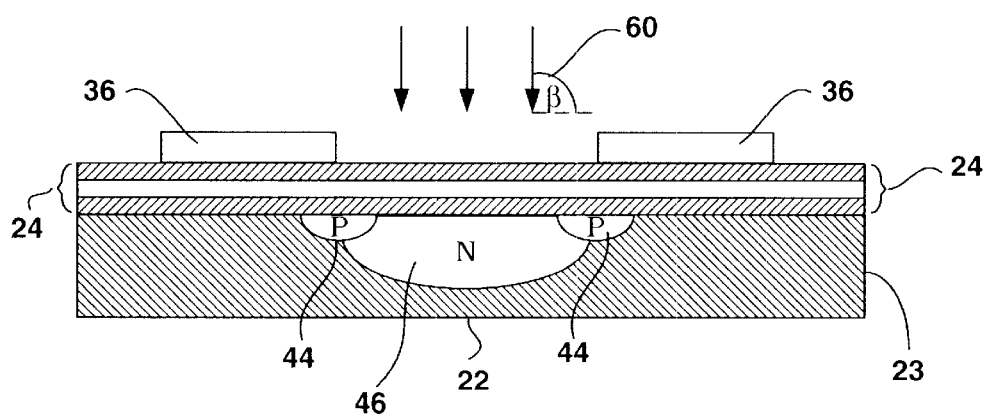

Once semiconductor substrate 22 has been doped with a p-type dopant, forming p-type regions 44, semiconductor substrate 22 is doped with an n-type dopant, as illustrated in FIG. 9. In one preferred embodiment of this invention, semiconductor substrate 22 is doped with an n-type dopant by using ion implantation. Preferably, n-type dopant comprises an element selected from the group consisting of antimony, arsenic, and phosphorus. In one preferred embodiment of this invention, semiconductor substrate 22 is doped with arsenic. Using the same hard mask 36, an n-type implant is then performed. The n-type implant 60 is preferably arsenic implanted at a dose of about $1\times10^{14} cm^{-2}$ to about $1\times10^{16} cm^{-2}$ at an implant energy of about 20 KeV to about 80 KeV. The n-type implant provides a high breakdown voltage for the drain node, which is needed during cell erasure. The n-type implant also forms the buried bit-line, which is a sub-surface conductive channel that carries a signal to each bit in the memory cell 20. The n-type implant is performed through ONO layer 24, but is masked out by hard mask 36, as illustrated in FIG. 9.

Preferably, the n-type implant is a direct implant 60 performed at an angle substantially normal to the principal surface 38 of the semiconductor substrate 22, such as about a 90° angle, as illustrated in FIG. 9. While the above ion implantation has been described with respect to arsenic, as will be appreciated by those of skill in the art, the same ion implantation may be readily accomplished with any other n-type dopant such as antimony or phosphorus.

In one preferred embodiment, once semiconductor substrate 22 has been doped with p-type and n-type dopants, the exposed ONO layer 24 is etched to expose part of semiconductor substrate 22. While in the above embodiment, the step of etching the exposed ONO layer 24 to expose part of the semiconductor substrate 22 is performed after the step of doping the semiconductor substrate 22 with p-type and n-type dopants, the step of etching the exposed ONO layer 24 to expose part of the semiconductor substrate 22 may be performed before the step of doping the semiconductor substrate 22 with p-type dopant or before the step of doping the semiconductor substrate 22 with n-type dopant.

Figure 10:
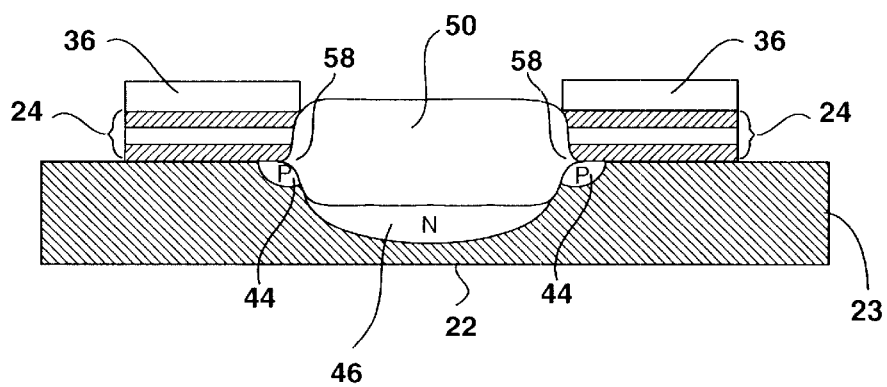

Once the ONO layer 24 has been etched and the semiconductor substrate 22 has been doped with p-type and n-type dopants, bit-line oxide region 50 is formed overlying the exposed semiconductor substrate 22, as illustrated in FIG. 10. Bit-line oxide region 50 is formed by growing a layer of silicon dioxide into and on top of the exposed semiconductor substrate 22. Because of the use of hard mask 36, bit-line oxide region 50 can be formed with hard mask 36 in place over ONO layer 24, as illustrated in FIG. 10. By forming bit-line oxide region 50 with hard mask 36 in place, the growth of bird's beak structures 58 can be kept to a minimum. Growth of bird's beak structures 58 is kept to a minimum because hard mask 36 acts a structural support member for ONO layer 24, preventing ONO layer 24 from curving upwards, as illustrated in FIG. 10 and FIG. 6. Keeping the growth of bird's beak structures 58 to a minimum allows the formation of memory cell 20 with greater critical dimension control and higher density.

After bit-line oxide region 50 is formed, hard mask 36 is removed from semiconductor substrate 22 and semiconductor substrate 22 is cleaned. In one preferred embodiment of this invention, hard mask 36 is removed and semiconductor substrate 22 is cleaned by preferably using a plasma etch process, however hard mask 36 can be removed and semiconductor substrate 22 can be cleaned using other comparable processes or methods known to those skilled in the art. A plasma etch process is a dry-etch process using reactive gases and plasma energy to cause a chemical reaction. Other methods of removing hard mask 36 from semiconductor substrate 22 may also be used, such as stripping hard mask 36 with hot phosphoric acid, sulfuric acid, or other chemicals known to one of ordinary skill in the art. In one preferred embodiment, use of the plasma etch process is preferred because the plasma etch process will selectively remove the silicon nitride, silicon oxi-nitride, or silicon rich nitride without substantially affecting the underlying ONO layer. In one preferred embodiment, use of the plasma etch process is preferred because the plasma etch process will selectively remove the polysilicon or silicon without substantially affecting the underlying ONO layer. For the etching of polysilicon or silicon, the reactive gases used in the plasma etch process are usually a combination of chlorine, helium, or hydrogen bromide. However other gases or combinations of gases known to those skilled in the art can also be used in the plasma etch process. In one preferred embodiment of this invention, hard mask 36 is stripped and semiconductor substrate 22 is cleaned by preferably using an $H_2O_2$ solution. Use of the $H_2O_2$ solution will selectively remove the tungsten, the titanium, or the titanium nitride without substantially affecting the underlying ONO layer.

Thus, there has been disclosed in accordance with the invention, a process for fabricating a memory cell using a hard mask that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications that fall within the scope of the appended claims and equivalents thereof.

What is claimed is:

1. A process for fabricating a memory cell comprising:

depositing a hard mask overlying an ONO layer, the ONO layer is formed over a semiconductor substrate having a principal surface;

patterning the hard mask;

implanting the semiconductor with a p-type dopant at an angle substantially normal to the principle surface of the semiconductor substrate, using the hard mask as an ion implant mask; and annealing the semiconductor substrate upon implanting the semiconductor substrate with a p-type dopant.

2. The process of claim 1, wherein the hard mask comprises a material selected from the group consisting of tungsten, titanium, titanium nitride, polysilicon, silicon, silicon nitride, silicon oxi-nitride, and silicon rich nitride.

3. The process of claim 1, wherein the annealing of the semiconductor substrate comprises the annealing of the semiconductor substrate in an RTA furnace.

4. The process of claim 1 further comprising implanting the semiconductor substrate with a n-type dopant using the hard mask as an ion implant mask.

5. The process of claim 4, wherein the n-type dopant comprises a material selected from the group consisting of antimony, arsenic, and phosphorus.

6. The process of claim 4, wherein the implanting of the semiconductor substrate with an n-type dopant comprises the using of ion implantation at an angle substantially normal to the principal surface of the semiconductor substrate.

7. The process of claim 4, wherein the implanting of the semiconductor substrate with an n-type dopant is performed after the annealing of the semiconductor substrate.

8. The process of claim 7 further comprising:

etching the exposed ONO layer to expose part of the semiconductor substrate;

forming a bit-line oxide region overlying the exposed semiconductor substrate; and removing the hard mask.

9. The process of claim 8, wherein the etching of the exposed ONO layer to expose part of the semiconductor substrate is performed before the implanting of the semiconductor substrate with a p-type dopant.

10. The process of claim 8, wherein the etching of the exposed ONO layer to expose part of the semiconductor substrate is performed after the implanting of the semiconductor substrate with a p-type dopant.

11. A process for making an electronic component comprising:

forming a memory cell by the process of claim 1; and forming the electronic component comprising the memory cell.

12. A process comprising:

depositing a hard mask overlying an ONO layer, the ONO layer is formed over a semiconductor substrate having a principal surface, and the ONO layer has a first silicon dioxide layer overlying the semiconductor substrate, a silicon nitride layer overlying the first silicon dioxide layer overlying the silicon nitride layer;

patterning the hard mask;

implanting the semiconductor substrate with a p-type dopant at an angle substantially normal to the principal surface of the semiconductor substrate, wherein the hard mask is used as an ion implant mask;

annealing the semiconductor substrate upon implanting the semiconductor substrate with a p-type dopant; and implanting the semiconductor substrate with an n-type dopant, wherein the hard mask is used as an ion implant mask.

13. The process of claim 12, wherein the step of implanting the semiconductor substrate with an n-type dopant comprises the step of implanting the semiconductor substrate with an n-type dopant at an angle substantially normal to the principal surface of the semiconductor substrate.

14. The process of claim 12 wherein the step of annealing the semiconductor substrate comprises annealing the semiconductor substrate in an RTA furnace.

15. The process of claim 14 further comprising.

etching the exposed ONO layer to expose part of the semiconductor substrate;

forming a bit-line oxide region overlying the exposed semiconductor substrate; and removing the hard mask.

16. A process for fabricating a memory cell comprising:

providing a semiconductor substrate having a principal surface;

forming an ONO layer over the semiconductor substrate, the ONO layer having a first silicon dioxide layer overlying the semiconductor substrate, a silicon nitride layer overlying the first silicon dioxide layer, and a second silicon dioxide layer overlying the silicon nitride layer;

depositing a hard mask overlying the ONO layer;

patterning the hard mask;

implanting the semiconductor substrate with a p-type dopant at an angle substantially normal to the principal surface of the semiconductor substrate;

annealing the semiconductor substrate upon implanting the semiconductor substrate with a p-type dopant; and implanting the semiconductor substrate with an n-type dopant at an angle substantially normal to the principal surface of the semiconductor substrate.

17. The process of claim 16 further comprising:

etching the exposed ONO layer to expose part of the semiconductor substrate;

forming a bit-line oxide region overlying the exposed semiconductor substrate; and removing the hard mask.

18. The process of claim 16, wherein the hard mask comprises a material selected from the group consisting of tungsten, titanium, titanium nitride, polysilicon, silicon, silicon nitride, silicon oxi-nitride, and silicon rich nitride.

19. The process of claim 16, wherein the hard mask has a thickness of about 500 to about 5000 angstroms.

* * * * *